United States Patent
Von Tuerkheim et al.

(10) Patent No.: US 12,052,550 B2
(45) Date of Patent: Jul. 30, 2024

(54) METHOD FOR PERFORMING ACOUSTIC MEASUREMENTS

(71) Applicant: Harman Becker Automotive Systems GmbH, Karlsbad (DE)

(72) Inventors: Friedrich Von Tuerkheim, Hamburg (DE); Stefan Finauer, Munich (DE); Adrian Von Dem Knesebeck, Munich (DE); Stefan Varga, Cologne (DE); Tobias Muench, Munich (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 36 days.

(21) Appl. No.: 17/790,229

(22) PCT Filed: Sep. 22, 2020

(86) PCT No.: PCT/EP2020/076368
§ 371 (c)(1),
(2) Date: Jun. 30, 2022

(87) PCT Pub. No.: WO2021/136605
PCT Pub. Date: Jul. 8, 2021

(65) Prior Publication Data
US 2023/0078170 A1    Mar. 16, 2023

(30) Foreign Application Priority Data
Dec. 30, 2019 (DE) .................... 10 2019 135 873.6

(51) Int. Cl.
*H04R 29/00* (2006.01)
*G01S 1/72* (2006.01)
*H04R 1/32* (2006.01)
*H04R 3/00* (2006.01)
*H04S 7/00* (2006.01)

(52) U.S. Cl.
CPC .............. *H04R 29/004* (2013.01); *G01S 1/72* (2013.01); *H04R 1/326* (2013.01); *H04R 3/00* (2013.01); *H04S 7/301* (2013.01)

(58) Field of Classification Search
CPC .......... H04R 1/326; H04R 3/00; H04R 3/004; H04R 3/04; H04R 3/12; H04R 5/04;
(Continued)

(56) References Cited

U.S. PATENT DOCUMENTS 9,215,542 B2 * 12/2015 Silzle .................... H04R 5/027
2005/0265560 A1 * 12/2005 Haulick ................. H04R 3/02
                                                                381/103
(Continued)

FOREIGN PATENT DOCUMENTS

| EP | 1349427 A2 | 10/2003 |
| JP | 2019140700 A | 8/2019 |
| WO | 2018102976 A1 | 6/2018 |

OTHER PUBLICATIONS

Anonymous, "Directivity of Microphones in Portable Devices," Apr. 12, 2016, Retrieved from the Internet on Dec. 7, 2020, URL: https://www.nti-audio.com/en/news/directivity-of-microphones-in-portable-devices, 6 pgs.
(Continued)

*Primary Examiner* — Thang V Tran
(74) *Attorney, Agent, or Firm* — Brooks Kushman P.C.

(57) ABSTRACT

A method comprises outputting at least one test signal to a listening environment via a loudspeaker, receiving each of the at least one test signal via a microphone arranged in the listening environment, determining at least one of a position and an orientation of the microphone in the listening environment with respect to the loudspeaker at the time of receipt of each of the at least one test signal, evaluating the test signals received by the microphone, and determining at least one aspect related to at least one transfer function based
(Continued)

on the evaluation of the test signal and on at least one of the position and the orientation of the microphone.

20 Claims, 2 Drawing Sheets

(58) Field of Classification Search
CPC .... H04R 29/00; H04R 29/001; H04R 29/002; H04R 29/004; H04R 29/005; H04S 7/00; H04S 7/30; H04S 7/301; G01S 1/72
See application file for complete search history.

(56) References Cited

U.S. PATENT DOCUMENTS

| 2008/0031471 | A1 | 2/2008 | Haulick et al. |
| 2013/0216071 | A1 | 8/2013 | Maher et al. |
| 2014/0003611 | A1* | 1/2014 | Mohammad ............. H04B 3/20 |
| | | | 381/66 |
| 2014/0369505 | A1* | 12/2014 | Lee .......................... H04R 3/12 |
| | | | 381/17 |
| 2015/0078596 | A1* | 3/2015 | Sprogis ................... H04S 7/302 |
| | | | 381/303 |
| 2017/0053641 | A1* | 2/2017 | Kamdar ............. G10K 11/1787 |
| 2017/0086004 | A1 | 3/2017 | Downing et al. |
| 2017/0289716 | A1* | 10/2017 | Mizumoto ........... H04R 29/005 |
| 2018/0139560 | A1* | 5/2018 | Shi ....................... H04R 29/001 |
| 2020/0029162 | A1* | 1/2020 | Matsunaga ......... G10L 21/0216 |

OTHER PUBLICATIONS

International Search Report dated Dec. 17, 2020 for PCT Appn. No. PCT/EP2020/076368 filed Sep. 22, 2020, 16 pgs.
European Office Action for EP Application No. 20786250.9 filed Jun. 27, 2022, dated May 29, 2024, 4 pages.

* cited by examiner

METHOD FOR PERFORMING ACOUSTIC MEASUREMENTS

CROSS-REFERENCE TO RELATED APPLICATION

This application is the U.S. national phase of PCT Application No. PCT/EP2020/076368 filed on Sep. 22, 2020, which claims priority to DE Application 10 2019 135 873.6 filed Dec. 30, 2019 the disclosures of which are hereby incorporated in their entirety by reference herein.

TECHNICAL FIELD

The disclosure relates to methods for performing acoustic measurements, in particular for determining at least one transfer function.

BACKGROUND

When reproducing sound (e.g., music) with an audio system, the reproduced audio content usually gets distorted to a certain degree. Distortion may occur at any point in the audio pathway, from the speaker to the ear of a user. This may strongly impair the listening experience of a user of the audio system. In one example, the audio pathway or reproduction chain comprises several different components such as the room the audio system is mounted in, and the loudspeakers of the audio system. Each component of the reproduction chain introduces an individual transfer function which contributes to the overall distortion. The room transfer function and the loudspeaker transfer function generally have a significant impact on the overall distortion and, therefore, on the sound quality as perceived by the user. There is a need for providing a method for performing acoustic measurements of at least one transfer function in order to be able to equalize temporal and spectral distortions during audio reproduction to provide a satisfactory sound quality to the user.

SUMMARY

A method includes outputting at least one test signal to a listening environment via a loudspeaker, receiving each of the at least one test signal via a microphone arranged in the listening environment, determining at least one of a position and an orientation of the microphone in the listening environment with respect to the loudspeaker at the time of receipt of each of the at least one test signal, evaluating the test signals received by the microphone, and determining at least one aspect related to at least one transfer function based on the evaluation of the test signal and on at least one of the position and the orientation of the microphone.

Other systems, methods, features and advantages will be or will become apparent to one with skill in the art upon examination of the following detailed description and figures. It is intended that all such additional systems, methods, features and advantages be included within this description, be within the scope of the invention and be protected by the following claims.

BRIEF DESCRIPTION OF THE DRAWINGS

The method may be better understood with reference to the following description and drawings. The components in the figures are not necessarily to scale, emphasis instead being placed upon illustrating the principles of the invention. Moreover, in the figures, like referenced numerals designate corresponding parts throughout the different views.

DETAILED DESCRIPTION

Figure 1:
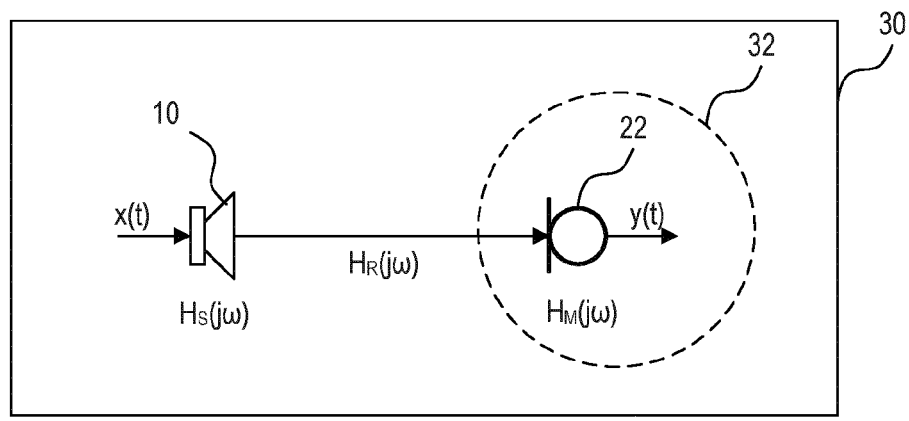
FIG. 1 schematically illustrates an exemplary audio system.

Referring to FIG. 1, an exemplary audio system is schematically illustrated. The audio system comprises a loudspeaker 10 and a microphone 22. The loudspeaker 10 is arranged in a listening environment 30 and is configured to output audio signals such as music, speech, or any other kind of audible sounds or tones. The microphone 22 is arranged distant from the loudspeaker 10 and is configured to receive the audio signals emitted from the loudspeaker 10. "Distant from" in this context entails that there is a distance of at least several centimeters between the loudspeaker 10 and the microphone 22. In common listening situations, the loudspeaker 10 is arranged at least 1 m, at least 2 m or even further from a user who listens to the audio. A listening position or listening area 32 is defined by the position of the user during audio reproduction. That is, the listening area 32 (or position) is an area (or position) within which audio that is output by the loudspeaker 10 is to be perceived by a user. The listening area 32 (or position) often is an area that is smaller than the listening environment 30. The listening area 32 may include the position of a user's head or, in particular, of a user's ears. While listening to audio reproduced by the loudspeaker 10, the user is predominantly located within the listening area 32. That is, if the user remains static in a single location, the listening area 32 is generally smaller as compared to situations where the user moves through the listening environment 30. The listening environment 30, therefore, in addition to the listening area 32 may comprise other areas, wherein the user is generally not located in the areas outside of the listening area 32. In some cases, however, if the user moves around a lot, the listening area 32 may cover the whole listening environment 30. In the example illustrated in FIG. 1, the microphone 22 is arranged at a listening position or in a listening area 32, while the loudspeaker 10 is arranged outside of the listening area 32.

The arrangement illustrated in FIG. 1 is configured to determine at least one aspect of at least one transfer function. An aspect related to a transfer function may include at least one of a frequency response, a phase response, estimated spectral properties, estimated properties in terms of time, and statistic properties of the respective transfer function. According to one example, only one aspect of at least one transfer function is determined. According to another example, two or more aspects of at least one transfer function are determined. According to an even further example, one or more transfer functions are determined in their entirety. In the following it is assumed that one or more transfer functions are determined in their entirety. However, it is to be understood that alternatively it is also possible to determine only aspects of the transfer functions mentioned below. It is also possible that at least one aspect of at least one transfer function not specifically mentioned herein in determined.

When a first audio signal x(t), for example, music or speech, is output by the loudspeaker 10, this signal usually gets distorted while travelling on the transmission path from the loudspeaker 10 to the listening area 32. This is because several components within the listening environment 30 introduce different transfer functions, resulting in an overall distortion of the first audio signal x(t). For example, the first audio signal x(t) may get distorted due to the room or listening environment 30 the loudspeaker 10 is arranged in. A room transfer function $H_R(j\omega)$ generally depends, for example, on a size of the room (listening environment 30), any furniture, plants or other objects arranged in the room. Such objects may comprise a carpet, book shelves, curtains, lamps, etc. However, the loudspeaker 10 and the microphone 22 themselves may also introduce further transfer functions $H_S(j\omega)$ (speaker transfer function), $H_M(j\omega)$ (microphone transfer function).

Figure 2:
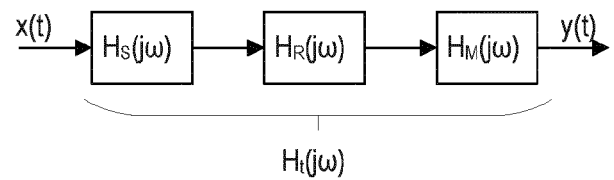
FIG. 2 schematically illustrates different transfer functions of an exemplary audio system.

An overall transfer function $H_t(j\omega)$, therefore, may be composed of the individual transfer functions $H_S(j\omega)$, $H_R(j\omega)$, $H_M(j\omega)$ (see, e.g., FIG. 2). According to one example, the following applies $$H_t(j\omega) = H_S(j\omega) * H_R(j\omega) * H_M(j\omega) \tag{1}$$

That is, an audio signal y(t) captured at a listening position or listening area 32 is a distorted version of the original first audio signal x(t) output by the loudspeaker 10. A user listening to audio output by the loudspeaker 10, therefore, may experience a disturbed sound experience. Therefore, many audio systems are configured to determine the overall transfer function $H_t(j\omega)$. When the overall transfer function $H_t(j\omega)$, or at least aspects of the overall transfer function $H_t(j\omega)$ are known, transfer function compensation may be performed when outputting audio. In one example, transfer function compensation may comprise frequency compensation or equalization. Correction filters may be applied that take into account at least one aspect of the transfer function. Generally, any suitable methods for compensating for the distortion may be applied.

As the transfer functions or aspects of the transfer functions in specific situations initially are usually unknown, measurement sequences may be performed in order to determine the involved transfer functions or aspects of the transfer functions. Different methods for measuring transfer functions are generally known. Common to all of such methods is the use of an excitation signal (stimulus) including all the frequencies of interest to feed the device under test. The response of the device under test is captured and compared with the original signal in a suitable way. Excitation signals with high energy may be used in order to achieve a sufficient signal-to-noise ratio over the entire frequency range of interest. Measurements (or estimations) of the distorting transfer functions or aspects of the transfer functions may be performed in order to provide corresponding compensation filters during a subsequent audio playback.

Determining an overall transfer function that takes into account all of the different components within the transmission path, however, may be complex. Many users do not possess a dedicated measurement microphone. One possibility however is to use a microphone 22 arranged in a portable electronic device 20 in order to determine the transfer function. The portable electronic device 20 may be a cellphone, smartphone, tablet, laptop, smart watch, or any other suitable electronic device. Most users today possess at least one suitable electronic device 20. Such portable electronic devices 20 usually already have built in microphones that are provided for many different functions of the portable electronic device 20. A test signal Sn may be output by the loudspeaker 10, which is received by the microphone 22 of the portable electronic device 20. The portable electronic device 20 or an external computing unit may then evaluate the received signal y(t). As the original signal x(t) is known, the system may determine the overall transfer function resulting from the individual transfer functions of the different components in the transmission path.

However, as has been described above, the microphone 22 generally introduces a further transfer function $H_M(j\omega)$ to the overall transfer function $H_t(j\omega)$. When a user is listening to audio, however, the microphone 22 is no longer a part of the transmission path. The microphone 22 is only involved during the measurement procedure. Therefore, compensation of the overall transfer function $H_t(j\omega)$ which includes the microphone transfer function $H_M(j\omega)$ may not result in a satisfactory listening experience. Taking into account the microphone transfer function $H_M(j\omega)$ during compensation may even lead to a poorer listening experience as compared to situations where no compensation is performed. Therefore, according to one example, the microphone transfer function $H_M(j\omega)$ is determined such that the microphone transfer function $H_M(j\omega)$ may be subtracted from the overall transfer function $H_t(j\omega)$.

Determining the transfer function of a microphone 22 of a portable electronic device 20 is generally challenging. The microphones 22 of portable electronic devices 20 usually have directional characteristics. That is, the transfer function of the microphone 22 is strongly dependent on the orientation of the portable electronic device 20 and, in particular, of the microphone 22 of the portable electronic device 20. The orientation of the electronic device 20, and therefore of the microphone 22 of the electronic device 20, during the measurement procedure may introduce unpredictable effects on the measurement results due to the directional characteristic of the microphone 22, and due to diffraction and shadowing effects of the electronic device 20 itself (e.g., smartphone enclosure).

However, if the transfer function $H_M(j\omega)$ of the microphone 22 that is used to perform the tests is not known, and this transfer function $H_M(j\omega)$ is not eliminated from the overall transfer function $H_t(j\omega)$ that is considered for transfer function compensation, sound perception for the user may be deteriorated.

Therefore, a position and/or an orientation of the portable electronic device 20 and in particular of the microphone 22 with respect to the loudspeaker 10 are determined while performing the test sequence. If the position and/or orientation of the microphone 22 are known, the microphone transfer function $H_M(j\omega)$ may be determined with sufficient accuracy. That is, the information about the position and/or orientation of the microphone 22 with respect to the loudspeaker 10 may be considered when determining the overall transfer function $H_t(j\omega)$ or the individual microphone transfer function $H_M(j\omega)$, respectively.

Figure 4:
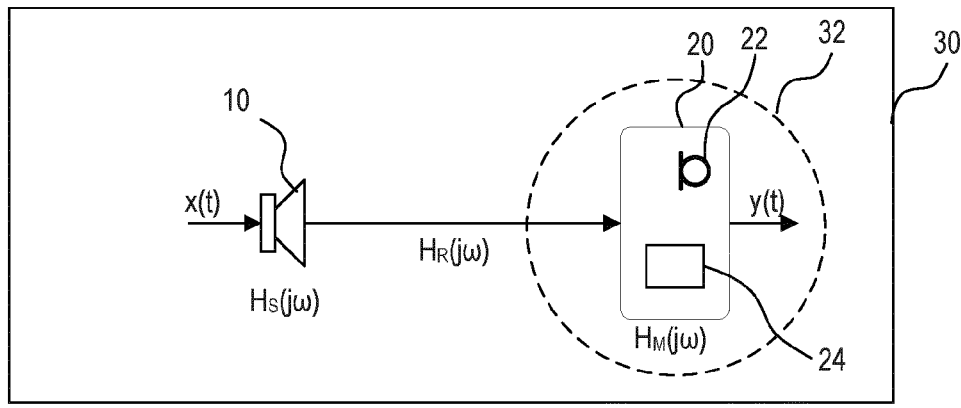
FIG. 4 schematically illustrates another exemplary audio system.

Many portable electronic devices 20 standardly comprise at least one sensor 24 (see FIG. 4). The at least one sensor 24 may comprise, for example, at least one of a camera, an acceleration sensor, a motion sensor, a gyroscope, a rotation sensor, a magnetic field sensor, and a proximity sensor. A position and/or orientation of the electronic device 20 may be determined via at least one sensor 24 of the electronic device 20. For example, a camera may take one or more images or videos of the listening environment 30 with the loudspeaker 10 arranged therein. The position and/or orientation of the microphone 22 with respect to the loudspeaker 10 may then be determined via suitable image processing methods. For example, a captured image or video may be analyzed and the loudspeaker 10 may be identified within the image or video through object recognition or computer vision techniques. Generally, different techniques are known which allow to perform edge detection, gradient matching, or similar techniques that are capable of identifying objects in an image or video. In one example, acceleration or motion sensors may provide information about an orientation of the microphone 22. Proximity sensors may determine a distance of the portable electronic device 20 with respect to any objects within the listening environment 30. Any other suitable sensors 24 may be used in order to determine a position and/or an orientation of the microphone 22 with respect to the loudspeaker 10.

A transfer function $H_M(j\omega)$ of the microphone 22 may be completely different when the microphone 22 is directed away from the loudspeaker 10 as compared to situations wherein the microphone 22 is directed towards the loudspeaker 10. The knowledge about the orientation of the microphone 22 with respect to the loudspeaker 10 therefore helps to determine the microphone transfer function $H_M(j\omega)$ and to improve the listening experience of the user.

Figure 3:
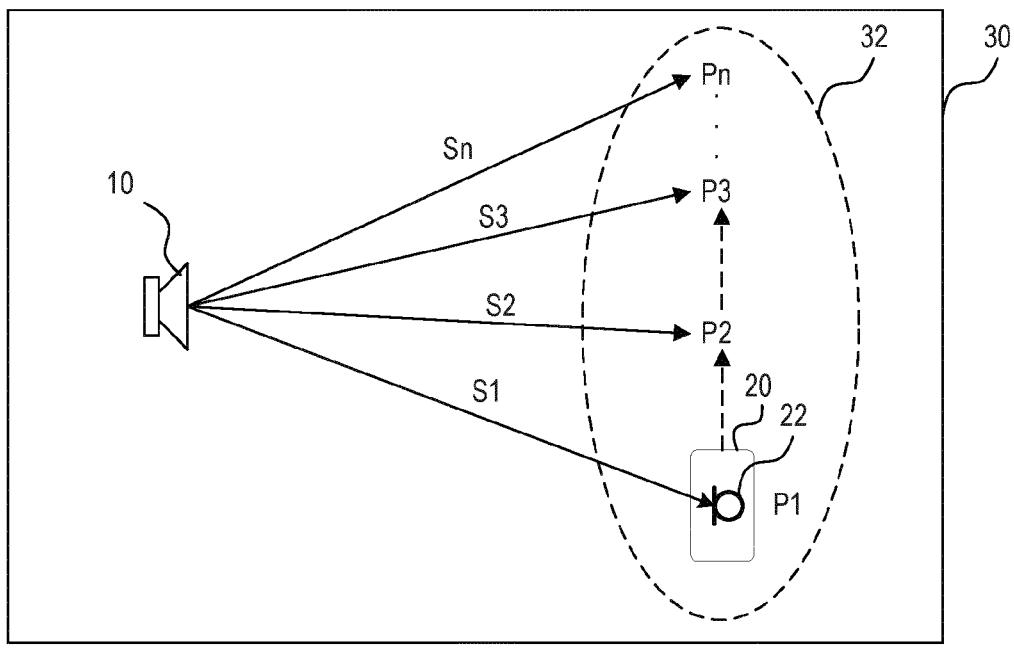
FIG. 3 schematically illustrates another exemplary audio system.

Before actually listening to desired audio output by the loudspeaker 10, a measurement process may be performed by the user. The user may position himself in the desired listening area 32. The user may hold the portable electronic device 20 in his hand while at least one test signal Sn is generated by the loudspeaker 10. An exemplary test sequence is schematically illustrated in FIG. 3. According to one example, a single test signal S1 may be output by the loudspeaker 10 and captured by the microphone 22 at a single test position P1. According to other examples, a plurality of test signals Sn may be output successively. In between the different test signals Sn, the user may move the electronic device 20 with the microphone 22 to a different test position Pn. In this way, test signals Sn may be received at different test positions Pn within the listening area 32. The determined measurement results from each of the plurality of test positions Pn may then be averaged. This average may later be considered when determining the microphone transfer function $H_M(j\omega)$ and accordingly equalizing distortions during audio reproduction. This results in a satisfactory listening experience for the user throughout the listening area 32. If the user remains static at a single listening position 32, a single test measurement (test signal S1 at test position P1, wherein test position P1 corresponds to listening position 32) may be sufficient. However, if the user intends to move around the listening area 32, more than one test measurement may be performed in order to improve the listening experience throughout the whole listening area 32.

Different test signals Sn of a test sequence may be identical. For example, each test signal may be output for a certain period of time, for example, a single test signal Sn may be output for 0.5 s up to several seconds. Generally, the test signal Sn should be long enough for the user to be able to hear the test signal Sn and position the electronic device 20 accordingly. There may be a pause in between the different test signals Sn which allows the user to reposition the electronic device 20. Each pause may last for, e.g., 1 s or more. According to one example, the user moves the electronic device 20 to the next test position Pn and remains static for the duration of the corresponding test signal Sn. According to another example, however, it is also possible that the user performs a single continuous movement. That is, the user may move the electronic device 20 in a single continuous movement, thereby moving the electronic device 20 past all of the required test position Pn. This aspect may be performed without actually pausing at the different test positions Pn. According to one example, the user moves the electronic device around his head once. It is also possible that only a single test signal S1 is output. This single test signal S1 may have a length of several seconds, for example. While this single test signal S1 is output, the user may move the electronic device 20 to different measurement positions Pn. Any kind of suitable test signal Sn may be used, e.g., noise or sweep signals. The kind of test signal Sn is generally not relevant for the performed measurements.

The number of test signals Sn and test positions Pn, for example, may depend on the size of the listening area 32. That is, if the user remains essentially static while listening to the audio, performing the test sequence with fewer test signals Sn at fewer test positions Pn may be sufficient in order to determine the corresponding transfer function. If the user intends to move around a comparably large listening area 32, the number of required test signals Sn and test positions Pn may be greater.

A difficulty arises if the electronic device 20 is not moved from one measurement position Pn to the other at a constant speed. Variations in speed may negatively affect the measurement results. It is also possible that the user still moves the electronic device 20 in cases where it is required that the electronic device 20 remains static at a test position Pn during the output of a corresponding test signal Sn.

According to one example, an application (app) is installed on the electronic device 20. This app may be used to start the test sequence. The user may open the app and press a corresponding button which starts the test sequence. In one example, the electronic device 20 may correspond with the loudspeaker 10 via a wired or wireless communication link. The loudspeaker 10 may be external to the electronic device 20. The portable electronic device 20 may cause the loudspeaker 10 to output at least one test signal Sn, e.g., by transmitting an according signal to the loudspeaker 10. Alternatively, however, it is also possible that another external device is involved in the process. The external device may communicate with both the electronic device 20 and the loudspeaker 10, and instruct the loudspeaker 10 to output the at least one test signal Sn. Once the test sequence has been started, the app may provide instructions to the user as to how to move the electronic device 20. For example, instructions may be output visually via a display of the electronic device 20 or as spoken instructions via a loudspeaker. The app may instruct the user as to how fast to move the electronic device. For example, arrows may be illustrated on the display indicating a direction in which the electronic device 20 is to be moved. In one example, the arrows could be illustrated in different colors. A green color could be an indication that the user is moving the electronic device at a desired speed. A red color could indicate a too slow or too fast movement, for example. A length, thickness or intensity of an arrow could indicate whether the electronic device is moved too slow or too fast. This, however, is only an example. Any other visual, audible or haptic indicators could be used in order to instruct the user as to how to move the electronic device 20.

According to one example, a camera of the electronic device 20 may be configured to record the surroundings of the electronic device 20. An image or video captured of the surroundings may be illustrated on the display of the electronic device 20. For example, the user may be required to move the electronic device 20 in a way such that the loudspeaker 10 is always captured by the camera during the test sequence. In one example, the loudspeaker 10 may be highlighted on the display. That is, a graphic marking (e.g., a circle, arrow, or cross) may be illustrated on the display at or adjacent to the position of the at least one loudspeaker 10. If the loudspeaker 10 is no longer captured by the camera and no marking appears on the display, the user may tell that the orientation of the electronic device 20 is incorrect. It is also possible that the electronic device outputs a warning if the orientation of the electronic device 20 is incorrect. This could be a visual, an acoustic, or a haptic warning, for example. In this way, it may be assured that the orientation, as well as the position of the loudspeaker 22 is correct during the course of the test sequence.

According to another example, no warnings are generated during the course of the test sequence. It is also possible that after finishing the test sequence, the user is informed that the test sequence was not performed correctly. In one example, the user may then be required to repeat the test sequence.

The at least one sensor 24 may be configured to monitor the position and/or orientation of the electronic device 20 throughout the complete test sequence. The position and/or orientation may be monitored continuously throughout the test sequence. It is also possible to monitor the position and/or orientation at defined time intervals throughout the test sequence. In this way, it may be determined whether the microphone 22 is directed in a wrong direction during the test sequence. This may happen, for example, if the user tilts the electronic device 20 too far in one direction such that the microphone 22 is no longer pointed sufficiently towards the loudspeaker 10.

According to one example, the orientation of the microphone 22 is determined throughout the complete test sequence. Information about the orientation of the microphone 22 during the test sequence may then be used in order to compensate the microphone transfer function $H_M(j\omega)$ for each point in time of the measurement sequence. In this case, knowledge about the direction-dependent microphone transfer function $H_M(j\omega)$ may be required. That is, for certain orientations of the microphone 22 with respect to the loudspeaker 10, a corresponding microphone transfer function $H_M(j\omega)$ may be known. Information about different transfer functions for different orientations may be stored in the electronic device 20, for example. For example, one transfer function may be associated with different orientations of the microphone 22 which fall into a defined angular range (e.g., angle between a main radiation direction of the loudspeaker 10 and a main receiving direction of a directional microphone). The smaller the angular range, the higher the accuracy of the compensation.

In many cases, more than one loudspeaker 10 of an audio system may be visible in an image taken by the camera of the electronic device 20. In this case, it may not be known to the system which of the loudspeakers 10 generates the test signals Sn. In such cases, the app may prompt the user to indicate which of the loudspeakers 10 will be used in the test sequence. If more than one loudspeaker 10 is arranged in a listening environment 30, a separate test sequence may be performed for each of the different loudspeakers 10 which are subsequently to be used to output audio.

If the position and the orientation of the microphone 22 are essentially constant throughout a test sequence, the transfer function $H_M(j\omega)$ of the microphone 22 (or of the electronic device 20) is deterministic. This aspect enables the microphone transfer function $H_M(j\omega)$ to be adequately determined and also compensates the determined microphone transfer function $H_M(j\omega)$ during subsequent audio processing. It is generally also possible that a manufacturer of the electronic device 20 or of an audio system performs test sequences beforehand, e.g., in an anechoic chamber, and provides information about the transfer function of the electronic device 20 or the microphone 22 which may be considered during subsequent audio processing. It is also possible to consider information about the directivity of the microphone 22 during subsequent audio processing. Such directivity information may be provided by a manufacturer of the microphone 22, for example, and may be stored in the electronic device 20. Signal processing during audio reproduction may subsequently compensate for the microphone directivity given a certain orientation of the microphone 22 at this specific point in time during the measurements.

Figure 5:
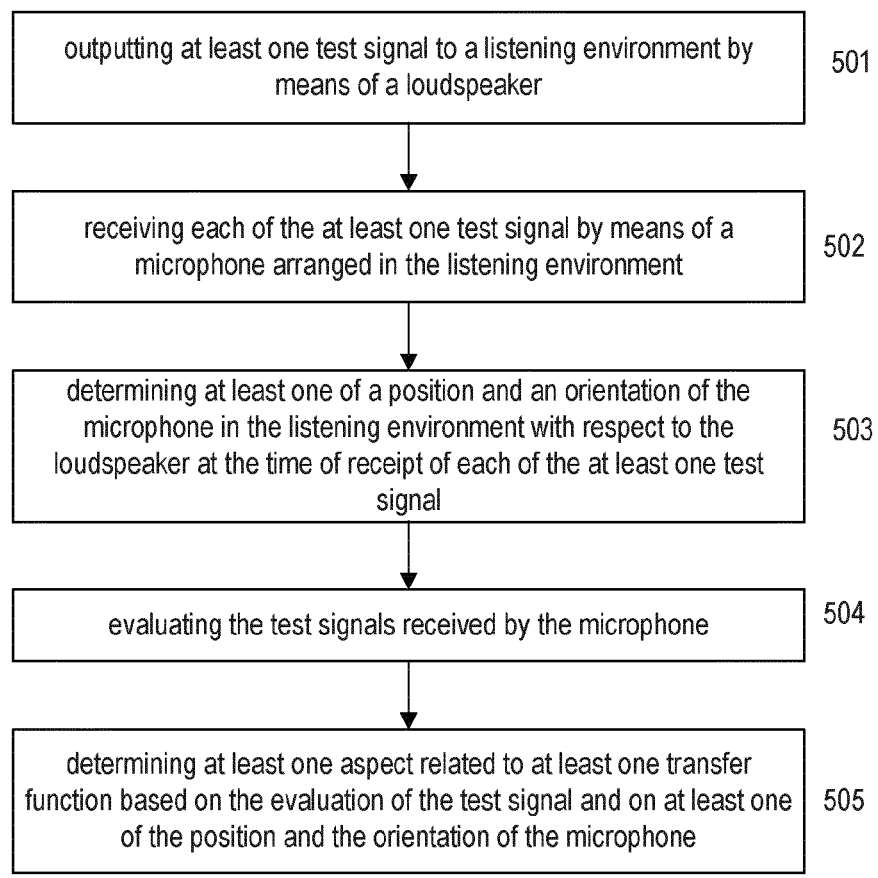
FIG. 5 schematically illustrates an exemplary method.

Now referring to FIG. 5, an exemplary method is schematically illustrated in a sequence diagram. The method includes outputting at least one test signal to a listening environment via a loudspeaker (step 501), receiving each of the at least one test signal via a microphone arranged in the listening environment (step 502), determining at least one of a position and an orientation of the microphone in the listening environment with respect to the loudspeaker at the time of receipt of each of the at least one test signal (step 503), evaluating the test signals received by the microphone (step 504), and determining at least one aspect related to at least one transfer function based on the evaluation of the test signal and on at least one of the position and the orientation of the microphone (step 505).

The at least one aspect related to at least one transfer function may comprise at least one of a frequency response, a phase response, estimated spectral properties, estimated properties in terms of time, and statistic properties of the respective transfer function.

Determining at least one aspect related to at least one transfer function may comprise determining the at least one transfer function.

Evaluating the test signals may comprise determining a change of at least one parameter of the at least one test signal occurring on the transmission path between the loudspeaker and the microphone.

Evaluating the test signals may comprise determining a change of a frequency response of at least one test signal occurring on the transmission path between the loudspeaker and the microphone.

Outputting at least one test signal may comprise either outputting of a plurality of subsequent test signals, wherein each test signal is received by the microphone at a different test position within the listening environment, or outputting of a single continuous test signal for a defined length of time, wherein the single continuous test signal is received by the microphone at different test positions within the listening environment.

The microphone may be arranged in a portable electronic device, the portable electronic device comprising a user interface, and the method may further comprise outputting at least one command via the user interface, providing instructions to a user of the portable electronic device concerning at least one of a position, an orientation, a speed of movement, and a line of movement of the microphone at or between the different test positions.

The user interface may comprise a display, and the method may further comprise capturing at least one image or a video of the listening environment and the loudspeaker arranged in the listening environment via at least one camera of the electronic device, displaying the at least one image or the video of the listening environment and the loudspeaker on the display of the electronic device, and marking the position of the loudspeaker in the displayed image or video.

Marking the position of the loudspeaker in the listening environment on the display may comprise presenting a graphic marking on the display at or adjacent to the position of the loudspeaker.

The method may further comprise, at the time of receipt of a test signal, comparing the position and/or orientation of the microphone in the listening environment with respect to the loudspeaker with a desired position and/or orientation, and generating a warning if the actual position and/or orientation does not correspond to the desired position and/or orientation.

The warning may comprise at least one of a visual, an acoustical and a haptic warning.

The position and/or orientation of the microphone in the listening environment with respect to the loudspeaker at the time of receipt of the test signal may be determined via at least one sensor of the portable electronic device.

The at least one sensor may comprise at least one of a camera, an acceleration sensor, a motion sensor, a gyroscope, a rotation sensor, a magnetic field sensor, and a proximity sensor.

The at least one transfer function may be a transfer function of the microphone.

Evaluating the test signals received by the at least one microphone may comprise evaluating each of the received test signals separately, resulting in a plurality of evaluation results, and averaging the evaluation results of the individual test signals.

It may be understood, that the illustrated methods and systems are merely examples. While various embodiments of the invention have been described, it will be apparent to those of ordinary skill in the art that many more embodiments and implementations are possible within the scope of the invention. In particular, the skilled person will recognize the interchangeability of various features from different embodiments. Although these techniques and systems have been disclosed in the context of certain embodiments and examples, it will be understood that these techniques and systems may be extended beyond the specifically disclosed embodiments to other embodiments and/or uses and obvious modifications thereof. Accordingly, the invention is not to be restricted except in light of the attached claims and their equivalents.

The description of embodiments has been presented for purposes of illustration and description. Suitable modifications and variations to the embodiments may be performed in light of the above description or may be acquired from practicing the methods. The described arrangements are exemplary in nature, and may include additional elements and/or omit elements. As used in this application, an element recited in the singular and proceeded with the word "a" or "an" should be understood as not excluding plural of said elements, unless such exclusion is stated. Furthermore, references to "one embodiment" or "one example" of the present disclosure are not intended to be interpreted as excluding the existence of additional embodiments that also incorporate the recited features. The terms "first," "second," and "third," etc. are used merely as labels, and are not intended to impose numerical requirements or a particular positional order on their objects. The described systems are exemplary in nature, and may include additional elements and/or omit elements. The subject matter of the present disclosure includes all novel and non-obvious combinations and sub-combinations of the various systems and configurations, and other features, functions, and/or properties disclosed. The following claims particularly point out subject matter from the above disclosure that is regarded as novel and non-obvious.

The invention claimed is:

1. A method comprising:
   outputting at least one test signal to a listening environment via a loudspeaker;
   receiving each of the at least one test signal via a microphone arranged in the listening environment;
   determining at least one of a position and an orientation of the microphone in the listening environment with respect to the loudspeaker at the time of receipt of each of the at least one test signal;
   evaluating the test signals received by the microphone; and
   determining at least one aspect related to at least one transfer function based on the evaluation of the test signal and on at least one of the position and the orientation of the microphone.

2. The method of claim 1, wherein the at least one aspect related to at least one transfer function comprises at least one of a frequency response, a phase response, estimated spectral properties, estimated properties in terms of time, and statistic properties of the respective transfer function.

3. The method of claim 1, wherein said determining the at least one aspect related to the at least one transfer function comprises determining the at least one transfer function.

4. The method of claim 1, wherein said evaluating the test signals comprises determining a change of at least one parameter of the at least one test signal occurring on a transmission path between the loudspeaker and the microphone.

5. The method of claim 4, wherein said evaluating the test signals comprises determining a change of a frequency response of at least one test signal occurring on the transmission path between the loudspeaker and the microphone.

6. The method of claim 1, wherein said outputting at least one test signal comprises:
   outputting of a plurality of subsequent test signals, wherein each test signal is received by the microphone at a different test position within the listening environment; or
   outputting of a single continuous test signal for a defined length of time, wherein the single continuous test signal is received by the microphone at different test positions within the listening environment.

7. The method of claim 6, wherein the microphone is arranged in a portable electronic device, the portable electronic device comprising a user interface, and wherein the method further comprises:
   outputting at least one command via the user interface, providing instructions to a user of the portable electronic device concerning at least one of a position, an orientation, a speed of movement, and a line of movement of the microphone at or between the different test positions.

8. The method of claim 7, wherein the user interface comprises a display, and wherein the method further comprises:
   capturing at least one image or a video of the listening environment and the loudspeaker arranged in the listening environment via at least one camera of the electronic device;
   displaying the at least one image or the video of the listening environment and the loudspeaker on the display of the electronic device; and marking the position of the loudspeaker in the displayed image or video.

9. The method of claim 8, wherein said marking the position of the loudspeaker in the listening environment on the display comprises presenting a graphic marking on the display at or adjacent to the position of the loudspeaker.

10. The method of claim 1, further comprising:
at the time of receipt of a test signal, comparing the position and/or orientation of the microphone in the listening environment with respect to the loudspeaker with at least one of a desired position or orientation; and
generating a warning if at least one of an actual position or orientation does not correspond to the at least one desired position or orientation.

11. The method of claim 10, wherein the warning comprises at least one of a visual, an acoustical and a haptic warning.

12. The method of claim 10, wherein the at least one of the desired position or orientation of the microphone in the listening environment with respect to the loudspeaker at the time of receipt of the test signal is determined via at least one sensor of a portable electronic device.

13. The method of claim 12, wherein the at least one sensor comprises at least one of a camera, an acceleration sensor, a motion sensor, a gyroscope, a rotation sensor, a magnetic field sensor, and a proximity sensor.

14. The method of claim 1, wherein the at least one transfer function is a transfer function of the microphone.

15. The method of claim 1, wherein said evaluating the test signal received by the microphone comprises:
evaluating each of the received test signals separately, resulting in a plurality of evaluation results; and
averaging the evaluation results of the individual test signals.

16. A method comprising:
outputting at least one test signal via a loudspeaker;
receiving each of the at least one test signal via a microphone;
determining at least one of a position and an orientation of the microphone with respect to the loudspeaker at the time of receipt of each of the at least one test signal;
evaluating the test signals received by the microphone; and
determining at least one aspect related to at least one transfer function based on the evaluation of the test signal and on at least one of the position and the orientation of the microphone.

17. The method of claim 16, wherein the at least one aspect related to at least one transfer function comprises at least one of a frequency response, a phase response, estimated spectral properties, estimated properties in terms of time, and statistic properties of the respective transfer function.

18. The method of claim 16, wherein said determining the at least one aspect related to at least one transfer function comprises determining the at least one transfer function.

19. The method of claim 16, wherein said evaluating the test signals comprises determining a change of at least one parameter of the at least one test signal occurring on a transmission path between the loudspeaker and the microphone.

20. The method of claim 19, wherein said evaluating the test signals comprises determining a change of a frequency response of at least one test signal occurring on the transmission path between the loudspeaker and the microphone.

* * * * *